United States Patent
Kim et al.

(10) Patent No.: US 10,572,039 B2
(45) Date of Patent: Feb. 25, 2020

(54) TOUCH SENSING DISPLAY DEVICE

(71) Applicant: Samsung Display Co., Ltd., Yongin-si (KR)

(72) Inventors: Tae-Joon Kim, Seongnam-si (KR);
Jun-Young Ko, Seoul (KR);
Sang-Kook Kim, Cheonan-si (KR);
Jin-Young Jeon, Gumi-si (KR);
Hyun-Wook Cho, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 33 days.

(21) Appl. No.: 15/376,965

(22) Filed: Dec. 13, 2016

(65) Prior Publication Data

US 2017/0205924 A1 Jul. 20, 2017

(30) Foreign Application Priority Data

Jan. 19, 2016 (KR) .................. 10-2016-0006357

(51) Int. Cl.
*G06F 3/041* (2006.01)
*G06F 3/044* (2006.01)
*H01L 27/32* (2006.01)

(52) U.S. Cl.
CPC ............ *G06F 3/0412* (2013.01); *G06F 3/044* (2013.01); *G06F 3/0414* (2013.01); *G06F 2203/04103* (2013.01); *H01L 27/323* (2013.01)

(58) Field of Classification Search
CPC ...... G06F 3/0412; G06F 3/0414; G06F 3/044; G06F 2203/04103; H01L 27/323
See application file for complete search history.

(56) References Cited

U.S. PATENT DOCUMENTS

| | | | | |
|---|---|---|---|---|
| 8,988,384 B2* | 3/2015 | Krah | ............... | G06F 3/0414 |
| | | | | 178/18.05 |
| 9,690,408 B1* | 6/2017 | Krah | ............... | G06F 3/0412 |
| 9,874,965 B2* | 1/2018 | Pedder | ........... | G06F 3/0414 |
| 2012/0056817 A1* | 3/2012 | Griffin | ........... | G06F 3/04886 |
| | | | | 345/173 |
| 2013/0222267 A1* | 8/2013 | Almalki | ........... | G06F 3/0416 |
| | | | | 345/173 |
| 2013/0249859 A1* | 9/2013 | Park | ............... | G06F 3/044 |
| | | | | 345/174 |
| 2014/0008203 A1* | 1/2014 | Nathan | ........... | H03K 17/962 |
| | | | | 200/600 |
| 2014/0191973 A1* | 7/2014 | Zellers | ........... | G06F 3/0414 |
| | | | | 345/168 |
| 2015/0015802 A1* | 1/2015 | Jeon | ............... | H05K 3/10 |
| | | | | 349/12 |

(Continued)

FOREIGN PATENT DOCUMENTS

KR 10-2015-0066885 6/2015

*Primary Examiner* — Grant Sitta

(74) *Attorney, Agent, or Firm* — H.C. Park & Associates, PLC

(57) ABSTRACT

A touch sensing display device including a first substrate with a display unit, a second substrate disposed on the first substrate, a window cover disposed on the second substrate, and a touch force sensor. The touch force sensor includes a first electrode disposed between the first substrate and the second substrate or on a bottom surface of the first substrate, and a second electrode disposed under the first substrate.

8 Claims, 7 Drawing Sheets

(56) References Cited

U.S. PATENT DOCUMENTS

| | | | |
|---|---|---|---|
| 2015/0277626 A1* | 10/2015 | Shinkai | G06F 3/044 345/174 |
| 2015/0277646 A1* | 10/2015 | Ogura | G06F 1/16 345/173 |
| 2015/0331517 A1* | 11/2015 | Filiz | G06F 3/0414 345/173 |
| 2016/0062517 A1* | 3/2016 | Meyer | G06F 3/0414 345/173 |
| 2016/0092015 A1* | 3/2016 | Al-Dahle | G06F 3/044 345/174 |
| 2016/0306481 A1* | 10/2016 | Filiz | G01L 1/16 |
| 2016/0357297 A1* | 12/2016 | Picciotto | G06F 3/0488 |
| 2017/0031495 A1* | 2/2017 | Smith | G06F 3/0416 |
| 2017/0075493 A1* | 3/2017 | Lee | G06F 3/0418 |
| 2017/0153737 A1* | 6/2017 | Chawda | G06F 3/0414 |
| 2017/0277296 A1* | 9/2017 | Reynolds | G06F 3/0414 |
| 2017/0336970 A1* | 11/2017 | Kim | G06F 3/0414 |
| 2017/0343128 A1* | 11/2017 | Chiu | F16L 37/40 |
| 2017/0357357 A1* | 12/2017 | Hinson | G06F 3/0414 |
| 2018/0088728 A1* | 3/2018 | Wurzel | G06F 1/163 |

\* cited by examiner

TOUCH SENSING DISPLAY DEVICE

CROSS-REFERENCE TO RELATED APPLICATION

This U.S. non-provisional patent application claims priority from and the benefit of Korean Patent Application No. 10-2016-0006357, filed on Jan. 19, 2016, which is hereby incorporated by reference for all purposes as if fully set forth herein.

BACKGROUND

Field

The invention generally relates to display devices, and more particularly, to touch sensing display devices including touch force sensors.

Discussion of the Background

A touch sensing unit (e.g., a touch screen panel) is an input device that allows a user's instruction to be input by selecting particular content displayed on the screen of a display device or the like with a user's hand or an object. The touch sensing unit may be formed on the display device and may convert a touch location or the like into an electrical signal. Specifically, the user's hand or the object may directly contact the touch sensing unit at the touch location. Since such a touch sensing unit may be substituted for a separate input device (such as a keyboard or mouse) connected to the display device, applications for touch sensing units have been growing. The touch sensing unit may include components such as a resistive overlay touch sensing unit, a photosensitive touch sensing unit, a capacitive touch sensing unit, and the like.

Among those touch sensing units, the capacitive touch sensing unit may include a touch location sensor and a touch force sensor. The touch location sensor may detect a touch location by sensing change in capacitance when the object (or the user's hand) comes in contact with the touch sensing unit, and may convert the touch location into an electrical signal. The touch force sensor may detect a touch force by sensing the magnitude of change in capacitance when the object (or the user's hand) comes in contact with the touch sensing unit, and may convert the touch force into an electrical signal.

Generally, the touch force sensor may be manufactured separately from the display device, and then may be attached on a bottom surface of the display device so as to measure the magnitude of the touch force on the display device. In this case, however, the thickness of the display device increases due to the thickness of the touch force sensor, and the manufacturing cost may increase. In particular, where the touch force sensor is attached to the bottom surface of the display device, additional thickness, cost and assembly time is required for cushion layers typically provided on both sides of the touch force sensor. Further, touch force sensors attached to the bottom surface of the display device are typically fabricated as an aluminum foil plus a PI (polyimide) film and thus include the thickness associated therewith The above information disclosed in this Background section is only for enhancement of understanding of the background of the inventive concepts, and, therefore, it may contain information that does not form the prior art that is already known in this country to a person of ordinary skill in the art.

SUMMARY

Display devices constructed according to the principles of the invention enable thinner display devices having touch force sensors by integrating the touch force sensor into the display device and/or eliminating one or more of the cushion layers. For example, one or more exemplary embodiments of the invention provide a touch sensing display device including a touch force sensor having one electrode disposed between a first substrate and a second substrate, rather than on the bottom surface of the display device. Such embodiments may also include only one, thinner, cushion layer One or more other exemplary embodiments provide touch sensing display devices including a touch force sensor having one electrode directly disposed on a bottom surface of a first substrate without a cushion layer therebetween.

Additional aspects will be set forth in the detailed description which follows, and, in part, will be apparent from the disclosure, or may be learned by practice of the inventive concept.

According to one aspect of the invention, a touch sensing display device may include a first substrate including a display unit, a second substrate disposed on the first substrate, a window cover disposed on the second substrate, and a touch force sensor. The touch force sensor may include a first electrode disposed between the first substrate and the second substrate or disposed on a bottom surface of the first substrate, and a second electrode disposed under the first substrate.

The first electrode may be disposed on a top surface of the first substrate.

The display unit may include a pixel electrode, an organic light emitting layer and a common electrode.

The first electrode may be the common electrode.

The touch sensing display device may be driven with a time sharing method including a display mode in which the display unit may display an image and a touch sensing mode in which the touch force sensor may sense a touch.

The first electrode may be disposed on a bottom surface of the second substrate.

The touch sensing display device may further include a set bracket disposed under the window cover, the set bracket accommodating the first substrate, the second substrate, and the touch force sensor. The second electrode may be a bottom portion of the set bracket.

The touch sensing display device may further include a cushion member disposed between the first substrate and the set bracket.

The touch sensing display device may further include a touch location sensor disposed between the second substrate and the window cover.

The first electrode may include a central portion and an outer portion adjacent to and surrounding the central portion. The first electrode may include a plurality of electrode patterns.

The electrode patterns disposed in the outer portion may have heights substantially greater than heights of the electrode patterns disposed in the central portion.

The electrode patterns disposed in the outer portion may have widths substantially greater than widths of the electrode patterns disposed in the central portion.

The first electrode and the second electrode may include at least one of silver (Ag), copper (Cu), and indium tin oxide (ITO).

According to another aspect of the invention, a touch sensing display device may include a first substrate including a display unit, a second substrate disposed on the first substrate, a window cover disposed on the second substrate, and a touch force sensor. The touch force sensor may include a first electrode disposed on a bottom surface of the first substrate, and a second electrode disposed under and spaced apart from the first substrate.

The touch sensing display device may further include a set bracket disposed under the window cover, the set bracket accommodating the first substrate, the second substrate, and the touch force sensor. The second electrode may be a bottom portion of the set bracket.

The touch sensing display device may further include a cushion member disposed between the first electrode and the set bracket.

The touch sensing display device further include a touch location sensor disposed between the second substrate and the window cover.

The first electrode may be divided into a central portion and an outer portion adjacent to and surrounding the central portion. The first electrode may include a plurality of electrode patterns.

The first electrode and the second electrode may include at least one of silver (Ag), copper (Cu), and indium tin oxide (ITO).

According to the foregoing principles and embodiments, the thickness of the display device and the cost of manufacturing the display device may be reduced compared to conventional devices.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
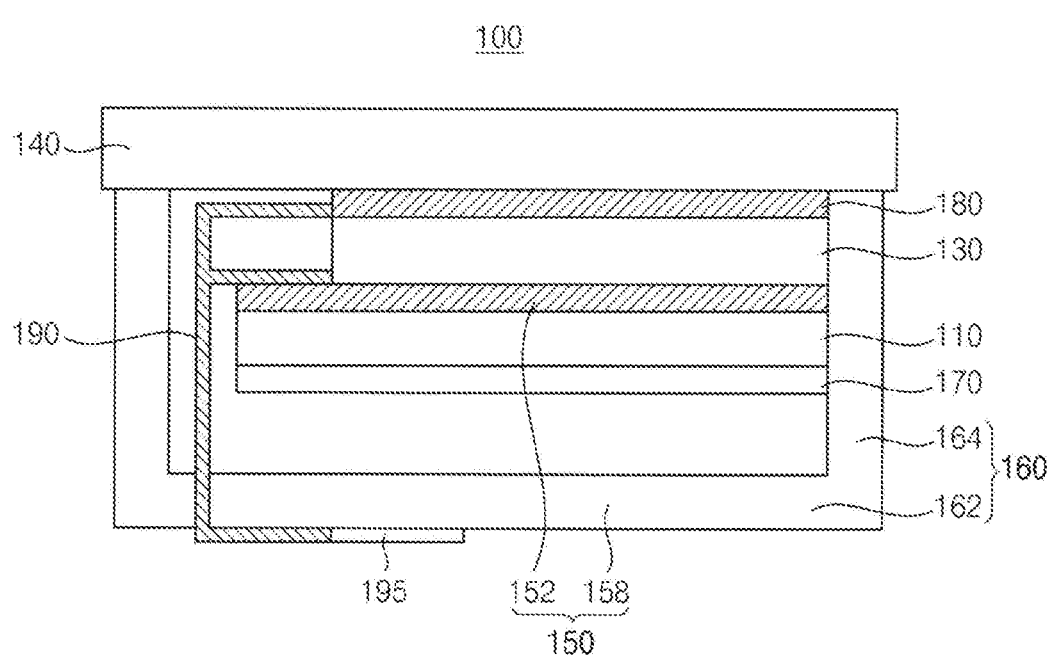
FIG. 1 is a cross-sectional view of a touch sensing display device constructed according to an exemplary embodiment of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Referring to FIG. 1, a touch sensing display device 100 may include a first substrate 110, a second substrate 130, a window cover 140, and a touch force sensor 150. The touch sensing display device 100 may further include a set bracket 160, a cushion member 170, a touch location sensor 180, a flexible printed circuit 190, and a printed circuit board 195.

Figure 2:
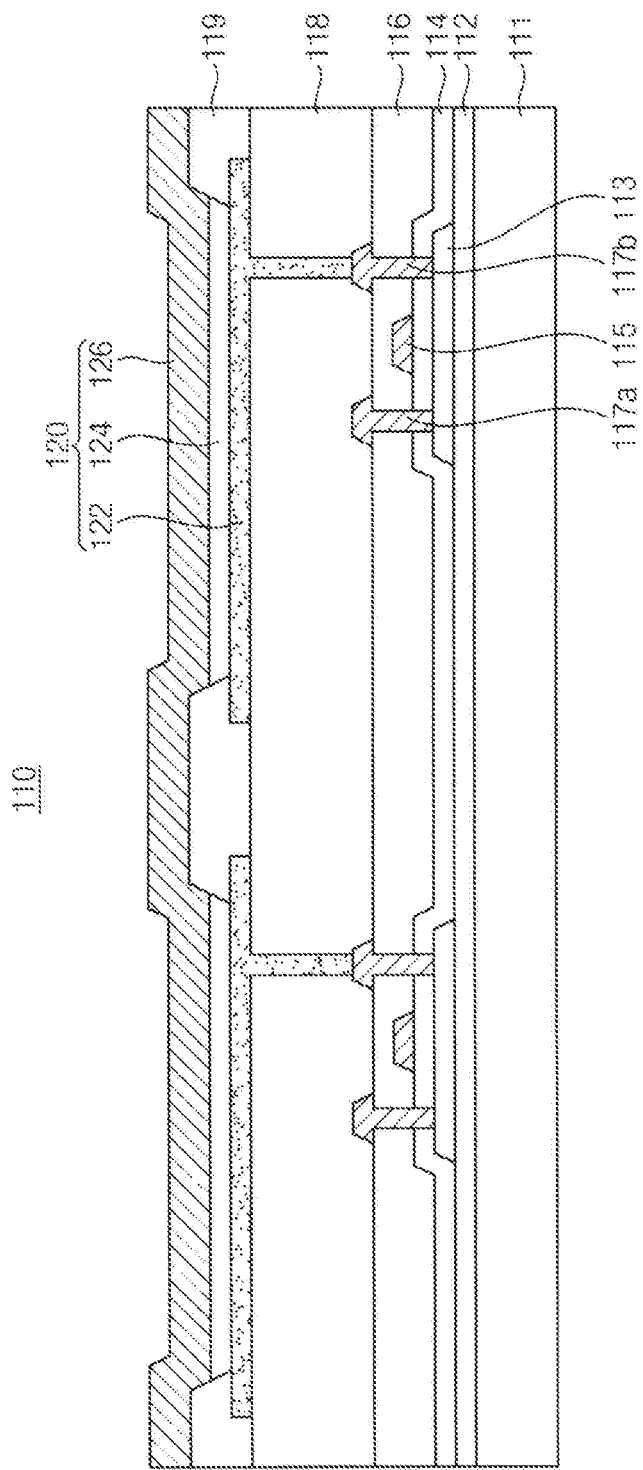
FIG. 2 is a cross-sectional view of the first substrate of the touch sensing display device of FIG. 1.

Referring to FIG. 2, the first substrate 110 may include a base substrate 111, a pixel circuit unit and a display unit which are disposed on the base substrate 111 and respectively include the elements described in further detail below.

A display region and a peripheral region substantially surrounding the display region may be defined in the first substrate 110. A plurality of pixels may be disposed in the display region to display images. For example, the pixels may be arranged in the display region as a substantial matrix structure. Each of the pixels may include a transistor and a display element 120.

The base substrate 111 may include a transparent insulation substrate such as a glass substrate, a quartz substrate, a plastic substrate, etc. Alternatively, the base substrate 111 may include a flexible substrate.

A buffer layer 112 may be disposed on the base substrate 111. The buffer layer 112 may substantially block the permeation of oxygen and/or moisture to upper structures including the transistor and the display element 120. The buffer layer 112 may include a silicon compound such as silicon oxide (SiOx), silicon nitride (SiNx), silicon oxynitride (SiOxNy), or other suitable materials.

The pixel circuit unit may include one transistor or a plurality of transistors. The transistor may be disposed on the buffer layer 112. The transistor may include an active pattern 113, a gate electrode 115, a source electrode 117a, and a drain electrode 117b.

The active pattern 113 may be disposed on the buffer layer 112. For example, the active pattern 113 may include material including silicon (e.g., polycrystalline silicon) or oxide semiconductor. The active pattern 113 may include a source region, a drain region, and a channel region disposed therebetween.

A gate insulation layer 114 may be disposed on the buffer layer 112, and may substantially cover the active pattern 113. The gate insulation layer 114 may include a silicon compound such as silicon oxide (SiOx), silicon nitride (SiNx), silicon oxynitride (SiOxNy), or other suitable materials.

The gate electrode 115 may be disposed on the gate insulation layer 114. The gate electrode 115 may be positioned over the channel region of the active pattern 113. The gate electrode 115 may include gold (Au), silver (Ag), copper (Cu), nickel (Ni), platinum (Pt), aluminum (Al), molybdenum (Mo), and/or titanium (Ti) or other suitable materials.

An insulation interlayer 116 may be disposed on the gate insulation layer 114, and may substantially cover the gate electrode 115. The insulation interlayer 116 may electrically insulate the gate electrode 115 from the source electrode 117a and the drain electrode 117b. The insulation interlayer 116 may include a silicon compound such as silicon oxide (SiOx), silicon nitride (SiNx), silicon oxynitride (SiOxNy), or other suitable materials.

The source electrode 117a and the drain electrode 117b may be disposed on the insulation interlayer 116. The source electrode 117a and the drain electrode 117b may be in contact with active pattern 113, respectively, through the insulation interlayer 116 and the gate insulation layer 114. Here, the source electrode 117a may be electrically connected to the source region of the active pattern 113, and the drain electrode 117b may be electrically connected to the drain region of the active pattern 113. The source electrode 117a and the drain electrode 117b may include gold (Au), silver (Ag), copper (Cu), nickel (Ni), platinum (Pt), aluminum (Al), molybdenum (Mo), and/or titanium (Ti) or other suitable materials.

A via insulation layer 118 may be disposed on the insulation interlayer 116, and may substantially cover the transistor. The via insulation layer 118 may have a substantially flat top surface. The via insulation layer 118 may include a silicon compound such as silicon oxide (SiOx), silicon nitride (SiNx), silicon oxynitride (SiOxNy), or other suitable materials. Alternatively, the via insulation layer 118 may include organic material such as polyimide, acryl, or other suitable organic material.

The display unit may include one display element 120 or a plurality of display elements 120. The display element 120 may be disposed on the via insulation layer 118. The display element 120 may include a pixel electrode 122, an organic light emitting layer 124, and a common electrode 126. The display element 120 may include the organic light emitting layer 124. Alternatively, the display element 120 may include a liquid crystal layer.

The pixel electrode 122 may be disposed on the via insulation layer 118. The pixel electrode 122 may be in contact with the drain electrode 117b through the via insulation layer 118. The pixel electrode 122 may be formed per each pixel. The pixel electrode 118 may include silver (Ag), magnesium (Mg), aluminum (Al), platinum (Pt), gold (Au), nickel (Ni), iridium (Ir), chrome (Cr), indium tin oxide (ITO), indium zinc oxide (IZO), zinc oxide (ZnO), and/or indium gallium oxide (IGO), or other suitable materials.

A pixel defining layer 119 may be disposed on the via insulation layer 118, and may partially expose the pixel electrode 122. The pixel defining layer 119 may have a pixel opening exposing a portion (e.g., a central portion) of the pixel electrode 122. The pixel defining layer 119 may include organic material or other suitable materials.

The organic light emitting layer 124 may be disposed on the exposed pixel electrode 122 and a portion of the pixel defining layer 119. When the organic light emitting layer 124 includes low molecular organic material, a hole injection layer, a hole transport layer, and so on, may be disposed under the organic light emitting layer 124, and an electron transport layer, an electron injection layer, and so on, may be disposed on the organic light emitting layer 124. When the organic light emitting layer 124 includes high molecular organic material, a hole transport layer, and so on, may be disposed under the organic light emitting layer 124.

The common electrode 126 may be disposed on the organic light emitting layer 124. The common electrode 126 may be substantially disposed on an entirety of the first substrate 110. The common electrode 126 may be formed per the plurality of pixels. The common electrode 126 may include silver (Ag), magnesium (Mg), aluminum (Al), platinum (Pt), gold (Au), nickel (Ni), iridium (Ir), chrome (Cr), indium tin oxide (ITO), indium zinc oxide (IZO), zinc oxide (ZnO), and/or indium gallium oxide (IGO) or other suitable materials.

Referring to FIG. 1 again, the second substrate 130 may be disposed over the first substrate 110, and may substantially face the first substrate 110. The second substrate 130 may serve as an encapsulation substrate for protecting the pixel circuit unit and the display unit. The second substrate 130 may include a transparent insulation substrate such as a glass substrate, a quartz substrate, a plastic substrate, and so on. Alternatively, the second substrate 130 may include a flexible substrate.

The window cover 140 may be disposed on the second substrate 130. The window cover 140 may protect the first substrate 110, the second substrate 130, and other elements, which are disposed thereunder. As illustrated in FIG. 1, an outer region of the window cover 140 may be supported by the set bracket 160 disposed thereunder.

The window cover 140 may have some flexibility. Thus, when force is applied on a top surface of the window cover 140, a portion of the window cover 140, which is not supported by the set bracket 160, may be bent and moved downward. When the force is removed, the deflected portion of the window cover 140 may elastically return to its original position. The flexibility of the window cover 140 may remain substantially semi-permanently until a breakdown of the window cover 140 occurs.

The set bracket 160 may be disposed under the window cover 140. The set bracket 160 may include a bottom portion 162 and a sidewall portion 164. The bottom portion 162 may be provided under the first substrate 110, and a top surface of the bottom portion 162 may be substantially paralleled to a bottom surface of the first substrate 110. The sidewall portion 164 may extend substantially upward from an end of the bottom portion 162, and may be substantially perpendicular to the bottom portion 162. In an exemplary embodiment, the sidewall portion 164 may be substantially integrally formed with the bottom portion 162. In another exemplary embodiment, the sidewall portion 164 may be separately formed with the bottom portion 162, and may be combined with the bottom portion 162. Accordingly, the set bracket 160 may accommodate the first substrate 110, the second substrate 130, and so on.

The touch force sensor 150 may include a first electrode 152 and a second electrode 158 which are spaced apart from each other. In various exemplary embodiments, the first electrode 152 may be disposed between the first substrate 110 and the second substrate 130. The first electrode 152 may be a moving electrode having a position that may be moved upward and downward, and the second electrode 158 may be a fixed electrode spaced apart from the first electrode 152 at a predetermined distance. The first electrode 152 and the second electrode 158 may include silver (Ag), copper (Cu), and/or indium tin oxide (ITO) or other suitable materials.

A distance between the first electrode 152 and the second electrode 158 may change depending on whether a touch force is applied to the window cover 140. Accordingly, a change of the capacitance between the first electrode 152 and the second electrode 158 may be induced by an applied touch force. The magnitude of the touch force may be calculated based on the change of the capacitance.

More specifically, when the position of the first electrode 152 is moved downward by the touch force from an upper portion of the display device 100, the distance between the first electrode 152 and the second electrode 158 may be reduced, and the change of the capacitance between the first electrode 152 and the second electrode 158 may be calculated by Equation 1 below. The magnitude of the change of the capacitance may depend on the change of distance between the first electrode 152 and the second electrode 158, and thus the touch force sensor 150 may calculate the touch force.

$$C = \mu \times \frac{A}{d} \qquad \text{Equation 1}$$

(where, C is a capacitance between electrodes, μ is a dielectric constant, A is an area of the electrodes, and d is a distance between the electrodes.)

In various exemplary embodiments, the first electrode 152 may be disposed on the top surface of the first substrate 110. For example, the first electrode 152 may correspond to the common electrode 126 of the display element 120. In other words, the common electrode 126 of the display element 120 may serve as the first electrode 152 of the touch force sensor 150. In this manner, the first electrode 152 of the touch force sensor 150 need not be formed as a separate element, thereby reducing the thickness and manufacturing cost of the touch sensing display device 100.

Figure 10:
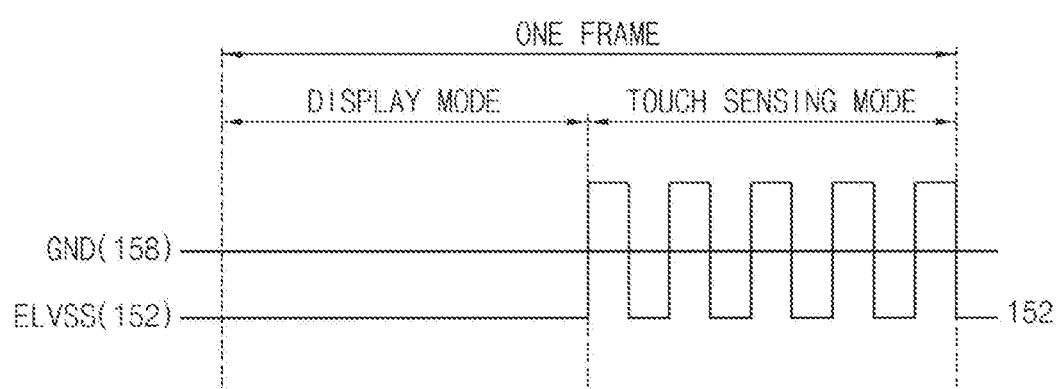
FIG. 10 is a view showing voltages applied to the first and second electrodes of the touch force sensor of the touch sensing display device of FIG. 1 when the touch sensing display device is driven with a time sharing method.

Referring to FIG. 10, in various exemplary embodiments, the touch sensing display device 100 may be driven with a time sharing method between a display mode in which the display unit displays images and a touch sensing mode in which the touch force sensor 150 senses the touch. For example, the touch sensing display device 100 may be driven in a display mode and a touch sensing mode within one frame period. According to one embodiment, the duration of the display mode may be substantially greater than that of the touch sensing mode to reduce degradation of the quality of the images or, the duration of the display mode may be substantially less than that of the touch sensing mode such that the accuracy and the sensitivity of touch sensing may be increased. In the display mode, a common voltage ELVSS may be applied to the first electrode 152 to control a current throughout the display unit thereby implementing the grayscales of the images. In the touch sensing mode, a constant voltage or a pulse voltage may be applied to the first electrode 152 and a ground voltage GND may be applied to the second electrode 158 thereby sensing the touch force.

The second electrode 158 may be disposed under the first substrate 110. For example, the second electrode 158 may correspond to the bottom portion 162 of the set bracket 160. In other words, the bottom portion 162 of the set bracket 160 that accommodates elements of the touch sensing display device 100 may serve as the second electrode 158 of the touch force sensor 150.

The cushion member 170 may be disposed between the first substrate 110 and the set bracket 160. For example, the cushion member 170 may be positioned between the first substrate 110 and the bottom portion 162 of the set bracket 160, and may be in contact with the bottom surface of the first substrate 110. According to the disposition of the cushion member 170, the distance between the first substrate 110 and the bottom portion 162 of the set bracket 160 may be maintained, and the durability of the touch sensing display device 100 may be improved.

The touch location sensor 180 may be disposed between the second substrate 130 and the window cover 140. The touch location sensor 180 may sense a touch location on the window cover 140. For example, the touch location sensor 180 may include driving electrodes and sensing electrodes between which mutual capacitance is formed, and may sense the touch location on the window cover 140 according to the change of the mutual capacitance when the user touches the window cover 140.

The printed circuit board 195 may be disposed on the set bracket 160, and may include a touch integrated circuit (IC) driving the touch force sensor 150 and the touch location sensor 180. The touch force sensor 150 and the touch location sensor 180 may be connected to the printed circuit board 195 through the flexible printed circuit 190, respectively.

Figure 3:
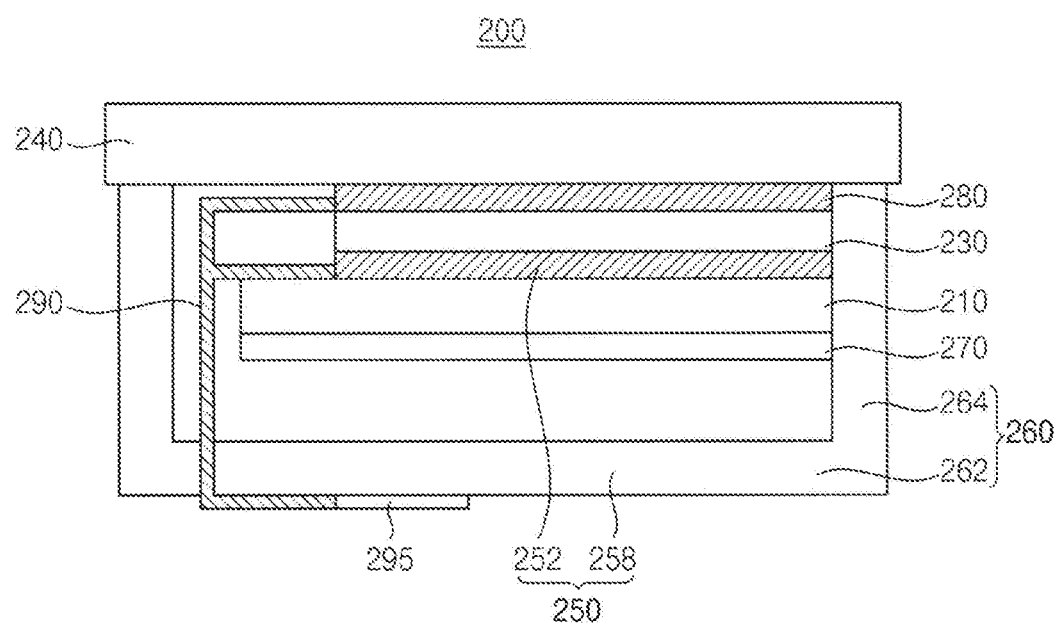
FIG. 3 is a cross-sectional view of a touch sensing display device constructed according to another exemplary embodiment of the invention.

Referring to FIG. 3, a touch sensing display device 200 may include a first substrate 210, a second substrate 230, a window cover 240, and a touch force sensor 250. The touch sensing display device 200 may further include a set bracket 260, a cushion member 270, a touch location sensor 280, a flexible printed circuit 290, and a printed circuit board 295.

Detailed description of elements of the touch sensing display device in FIG. 3 which are substantially the same as or similar to those explained with reference to FIGS. 1 and 2 will not be repeated for the sake of brevity.

The touch force sensor 250 may include a first electrode 252 and a second electrode 258 which are spaced apart from each other. The first electrode 252 may be a moving electrode which may be moved upward and downward, and the second electrode 258 may be a fixed electrode spaced apart from the first electrode 252 in a predetermined distance at equilibrium. The first electrode 252 and the second electrode 258 may include silver (Ag), copper (Cu), and/or indium tin oxide (ITO) or other suitable materials.

The first electrode 252 may be disposed on the bottom surface of the second substrate 230. Thus, the first electrode 252 may be formed on the bottom surface of the second substrate 230 in a method substantially the same as or similar to that of the aforementioned pixel electrode 122 or common electrode 126 thereby reducing the cost of manufacturing to attach a separate touch force sensor to the touch sensing display device 200.

Figure 4:
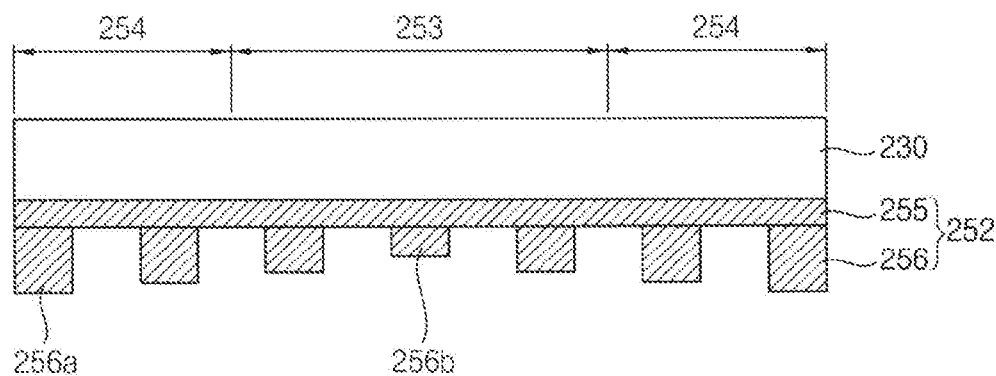
FIG. 4 is a cross-sectional view of an exemplary first electrode of the touch force sensor of the touch sensing display device of FIG. 3.

Referring to FIG. 4, the first electrode 252 may include a first electrode layer 255 and a plurality of electrode patterns 256. The first electrode layer 255 may be disposed on the bottom surface of the second substrate 230. The electrode patterns 256 may be disposed on the bottom surface of the first electrode layer 255 and may protrude from the first electrode layer 255 toward the second electrode 258. Each of the electrode patterns 256 may have a rectangular cross-sectional shape, however, the cross-sectional shape of each of the electrode patterns 256 could also be different. For example, each of the electrode patterns 256 may have a circular cross-sectional shape or a hexagonal cross-sectional shape.

The height of an electrode pattern 256a disposed in the outer portion 254 of the first electrode 252 may be substantially greater than that of an electrode pattern 256b disposed in the central portion 253 of the first electrode 252. For example, the height of the electrode pattern 256 may gradually increase from one electrode 256 to another when moving in a direction from the central portion 253 to the outer portion 254.

Figure 5A:
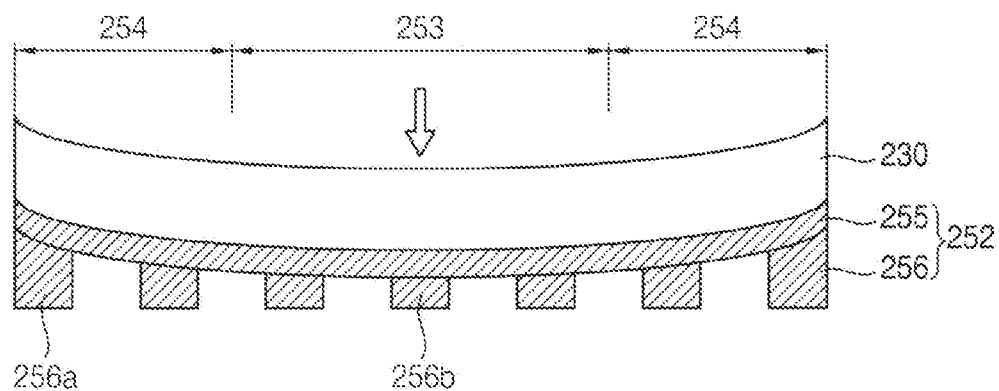
FIGS. 5A and 5B are cross-sectional views of bent states of the first electrode of FIG. 4.
Figure 5B:
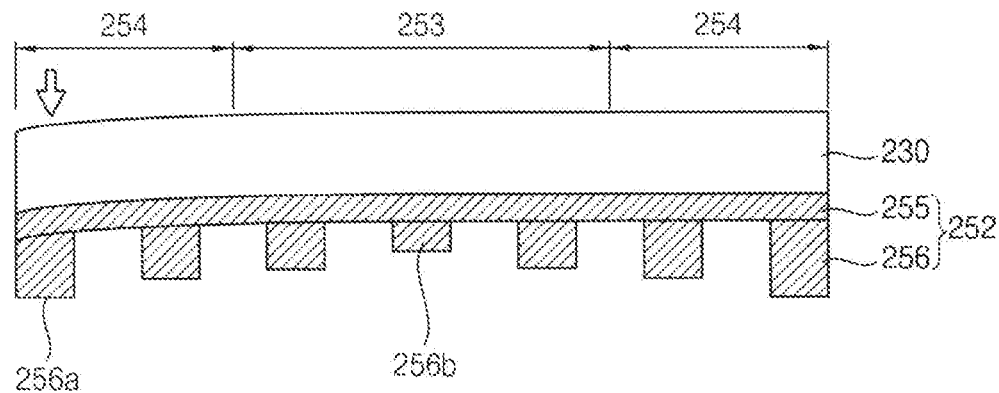

Referring to FIGS. 5A and 5B, even though substantially the same force is applied from the top of the second substrate 230, the degree of bending of the first electrode 252 may be different depending on the location of the applied force on the second substrate 230. As illustrated in FIG. 5A, when the force is applied to the central portion 253 of the first electrode 252, the degree of bending of the first electrode 252 may be relatively large. As illustrated in FIG. 5B, when the force is applied to the outer portion 254 of the first electrode 252, the degree of bending of the first electrode 252 may be relatively small. Therefore, as described above, when the height of the electrode pattern 256a disposed in the outer portion 254 of the first electrode 252 is substantially greater than that the height of the electrode pattern 256b disposed in the central portion 253 of the first electrode 252 and substantially the same force is applied throughout the central and outer portions 253 and 254, the magnitude of the change of the capacitance between the first electrode 252 and the second electrode 258 may be substantially the same throughout the central and outer portions 253 and 254, and the touch force sensor 250 may correctly calculate the applied force.

Figure 6:
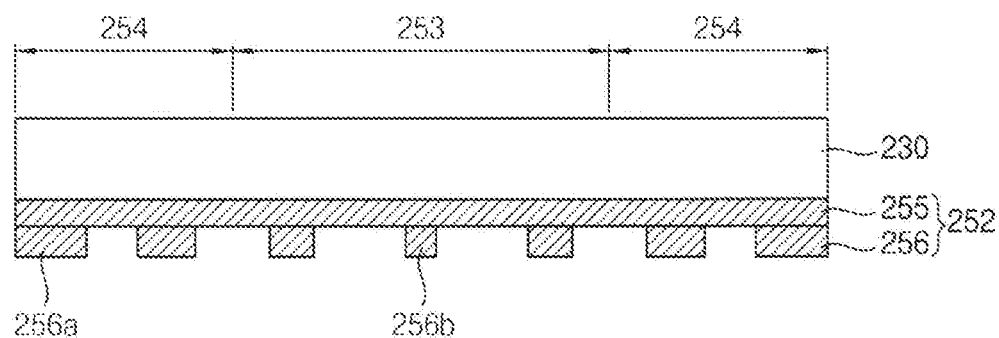
FIG. 6 is a cross-sectional view of another exemplary first electrode of the touch force sensor of the touch sensing display device of FIG. 3.

Referring to FIG. 6, in some example embodiments, the width of an electrode pattern 256a disposed in the outer portion 254 of the first electrode 252 may be substantially greater than that of an electrode pattern 256b disposed in the central portion 253 of the first electrode 252. For example, the width of the electrode pattern 256 may gradually increase from one electrode 256 to another when moving in a direction from the central portion 253 to the outer portion 254.

As described above, even though substantially the same force is applied from top to bottom of the second substrate 230, the degree of bending of the first electrode 252 may be different depending on the location on the second substrate 230 of the applied force. When the force is applied to the central portion 253 of the first electrode 252, the degree of bending of the first electrode 252 may be relatively large. When the force is applied to the outer portion 254 of the first electrode 252, the degree of bending of the first electrode 252 may be relatively small. Because the denominator of the second element of the right side of the Equation 1, is different depending on the location of the applied force, the magnitude of the change of the capacitance may be different depending on the location of the applied force even though the substantially the same force is applied throughout the central and outer portions 253 and 254.

Therefore, as described above, when the width of the electrode pattern 256a disposed in the outer portion 254 of the first electrode 252 is substantially greater than that the width of the electrode pattern 256b disposed in the central portion 253 of the first electrode 252 and substantially the same force is applied throughout the central and outer portions 253 and 254, the magnitude of the change of the capacitance between the first electrode 252 and the second electrode 258 may be substantially the same throughout the central and outer portions 253 and 254, and the touch force sensor 250 may correctly calculate the applied force.

Figure 7:
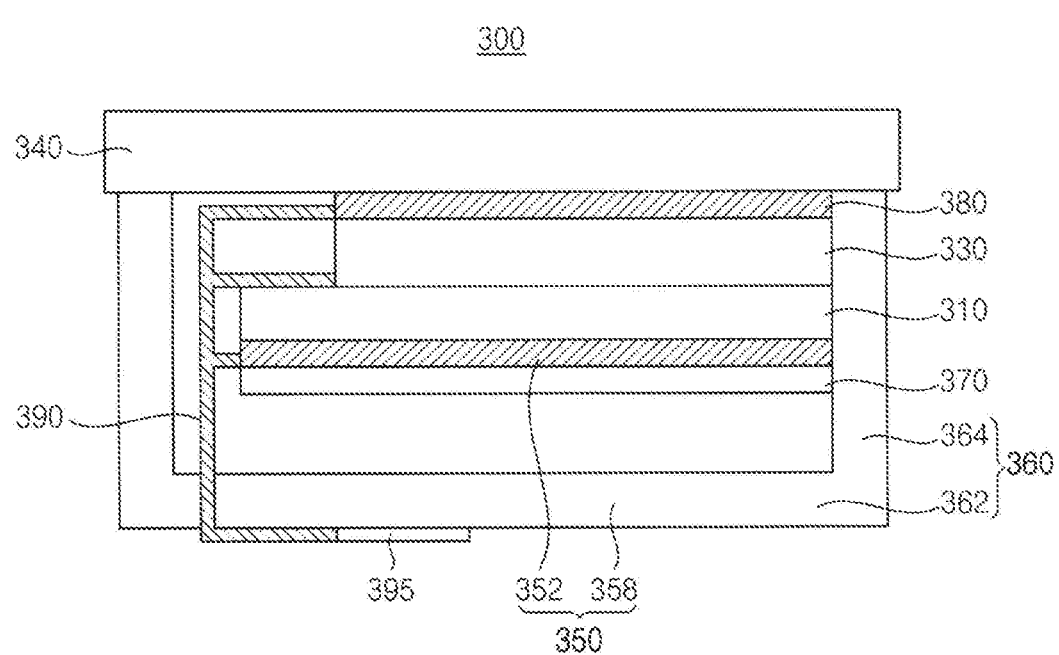
FIG. 7 is a cross-sectional view of a touch sensing display device constructed according to a further exemplary embodiment of the invention.

Referring to FIG. 7, a touch sensing display device 300 may include a first substrate 310, a second substrate 330, a window cover 340, and a touch force sensor 350. The touch sensing display device 300 may further include a set bracket 360, a cushion member 370, a touch location sensor 380, a flexible printed circuit 390, and a printed circuit board 395.

Detailed description on elements of the touch sensing display device in FIG. 7 which are substantially the same as or similar to those explained with reference to FIGS. 1, 2 and 3 will not be repeated here, for the sake of brevity.

The touch force sensor 350 may include a first electrode 352 and a second electrode 358 which are spaced apart from each other. The first electrode 352 may be a moving electrode of which position may be moved upward and downward, and the second electrode 358 may be a fixed electrode spaced apart from the first electrode 352 in a predetermined distance. The first electrode 352 and the second electrode 358 may include silver (Ag), copper (Cu), and/or indium tin oxide (ITO).

The first electrode 352 may be disposed on a bottom surface of the first substrate 310. Thus, the first electrode 352 may be formed on the bottom surface of the first substrate 310 in a method substantially the same as or similar to that of the aforementioned pixel electrode 122 or common electrode 126 thereby reducing the cost of manufacturing where a separate touch force sensor is attached to the touch sensing display device 300.

Figure 8:
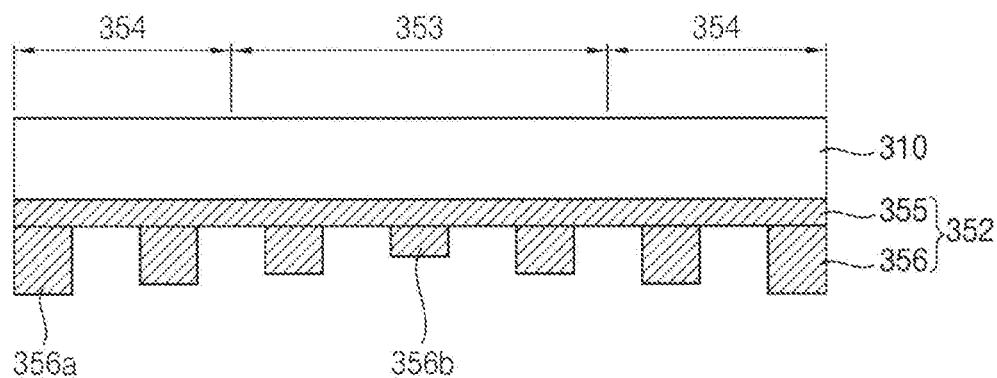
FIGS. 8 and 9 are cross-sectional views of first electrodes of the touch force sensor included in the touch sensing display device of FIG. 7.
Figure 9:
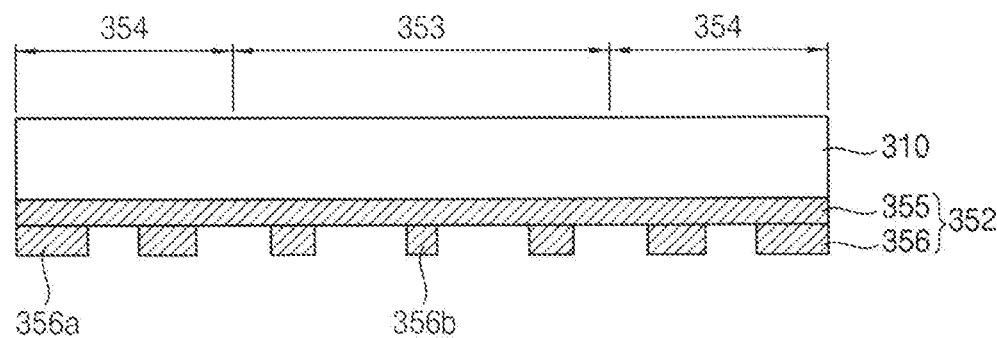

Referring to FIGS. 8 and 9, the first electrode 352 may include a first electrode layer 355 and a plurality of electrode patterns 356. Detailed description on the first electrode 352 in FIGS. 8 and 9 which is substantially the same as or similar to those explained with reference to FIGS. 4, 5A, 5B and 6 will not be repeated here, for the sake of brevity.

Referring to FIG. 7 again, the cushion member 370 may be disposed between the first electrode 352 and the set bracket 360. For example, the cushion member 370 may be positioned between the first electrode 352 and the bottom portion 362 of the set bracket 360, and may be in contact with the bottom surface of the first electrode 352. By using the cushion member 370 in this manner, the distance between the first electrode 352 and the bottom portion 362 of the set bracket 360 may be maintained, and the durability of the touch sensing display device 300 may be improved. Additionally, the cushion member 370 may prevent the first electrode 352 from being in contact with the bottom portion 362 of the set bracket 360 which corresponds to the second electrode 358 of the touch force sensor 350.

Although touch sensing display devices in accordance with various exemplary embodiments have been described with reference to the accompanying drawings, the present invention is not limited thereto. Those skilled in the art will readily appreciate that many modifications are possible in the example embodiments without materially departing from the novel teachings and advantages of the present inventive concept.

The touch sensing display devices according to example embodiments may be applied to various electronic devices. For example, the flexible touch sensing units may be applied to computers, notebooks, mobile phones, smart phones, smart pads, personal media players (PMP), personal digital assistance (PDA), MP3 players, digital cameras, video camcorders, and so on.

What is claimed is:

1. A touch sensing display device, comprising:
   a first substrate including a display unit;
   a second substrate disposed on the first substrate;
   a window cover disposed on the second substrate;
   a touch force sensor including a first electrode disposed on a bottom surface of the first substrate, and a second electrode disposed under the first substrate;
   a set bracket disposed under the window cover, the set bracket accommodating the first substrate, the second substrate, and the touch force sensor, wherein the second electrode is a bottom portion of the set bracket; and
   a cushion member disposed between the first substrate and the bottom portion of the set bracket.

2. The touch sensing display device of claim 1, wherein the touch sensing display device is driven with a time sharing method including a display mode in which the display unit displays an image and a touch sensing mode in which the touch force sensor senses a touch.

3. The touch sensing display device of claim 1, further comprising a touch location sensor disposed between the second substrate and the window cover.

4. The touch sensing display device of claim 1, wherein the first electrode comprises a central portion and an outer portion adjacent to and surrounding the central portion, and the first electrode includes a plurality of electrode patterns.

5. The touch sensing display device of claim 4, wherein the electrode patterns disposed in the outer portion have heights greater than heights of the electrode patterns disposed in the central portion.

6. The touch sensing display device of claim 4, wherein the electrode patterns disposed in the outer portion have widths greater than widths of the electrode patterns disposed in the central portion.

7. The touch sensing display device of claim 1, wherein the first electrode and the second electrode includes at least one of silver (Ag), copper (Cu), and indium tin oxide (ITO).

8. The touch sensing display device of claim 1, wherein the second electrode is disposed under and spaced apart from the first electrode.

* * * * *